(12) United States Patent
Saito

(10) Patent No.: US 11,626,818 B2
(45) Date of Patent: Apr. 11, 2023

(54) SUBSTRATE PROCESSING APPARATUS, AND TEMPERATURE CONTROL METHOD

(71) Applicant: Tokyo Electron Limited, Tokyo (JP)

(72) Inventor: Hideto Saito, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/240,195

(22) Filed: Apr. 26, 2021

(65) Prior Publication Data

US 2021/0344288 A1 Nov. 4, 2021

(30) Foreign Application Priority Data

May 1, 2020 (JP) .............................. JP2020-081397

(51) Int. Cl.
| | |
|---|---|
| *H02N 13/00* | (2006.01) |
| *F28F 27/00* | (2006.01) |
| *H01L 21/67* | (2006.01) |
| *H01L 21/683* | (2006.01) |
| *C23C 16/46* | (2006.01) |

(52) U.S. Cl.
CPC ............. *H02N 13/00* (2013.01); *F28F 27/00* (2013.01); *H01L 21/67248* (2013.01); *H01L 21/6831* (2013.01); *C23C 16/46* (2013.01)

(58) Field of Classification Search
CPC ....... H02N 13/00; F28F 27/00; H01L 21/683; H01L 21/67; H01L 21/6833; H01L 21/67069; H01L 21/67288; H01L 21/67248; H01L 21/6831; H01L 21/68785; H01J 37/32; C23C 16/46
USPC ........................................................ 361/234
See application file for complete search history.

(56) References Cited

U.S. PATENT DOCUMENTS

| | | | | |
|---|---|---|---|---|
| 5,835,334 A | * | 11/1998 | McMillin | ............ H01L 21/6831 |
| | | | | 279/128 |
| 2003/0161088 A1 | * | 8/2003 | Migita | ................ H01L 21/6831 |
| | | | | 361/234 |
| 2017/0011890 A1 | * | 1/2017 | Aramaki | ............. C23C 16/4586 |

FOREIGN PATENT DOCUMENTS

| | | |
|---|---|---|
| JP | 2000-021962 A | 1/2000 |
| JP | 2005-072286 A | 3/2005 |

* cited by examiner

*Primary Examiner* — Danny Nguyen
(74) *Attorney, Agent, or Firm* — Nath, Goldberg & Meyer; Jerald L. Meyer; Tanya E. Harkins

(57) ABSTRACT

A substrate processing apparatus includes a stage on which a substrate is placed, wherein the stage includes a first plate, a first temperature adjustment mechanism configured to control a temperature of the first plate, a second plate provided below the first plate, a second temperature adjustment mechanism configured to control a temperature of the second plate, and a fastening member configured to fasten the first plate and the second plate.

20 Claims, 9 Drawing Sheets

SUBSTRATE PROCESSING APPARATUS, AND TEMPERATURE CONTROL METHOD

CROSS-REFERENCE TO RELATED APPLICATION

This application is based upon and claims the benefit of priority from Japanese Patent Application No. 2020-081397, filed on May 1, 2020, the entire contents of which are incorporated herein by reference.

TECHNICAL FIELD

The present disclosure relates to a substrate processing apparatus, a stage, and a temperature control method.

BACKGROUND

Deformation such as warpage may occur in a substrate by a process (see, for example, Patent Document 1). In addition, deformation such as warpage may occur in a stage due to thermal stress (see, for example, Patent Document 2).

PRIOR ART DOCUMENT

Patent Document

Patent Document 1: Japanese Laid-Open Patent Publication No. 2005-072286
Patent Document 2: Japanese Laid-Open Patent Publication No. 2000-021962

SUMMARY

According to one embodiment of the present disclosure, a substrate processing apparatus includes a stage on which a substrate is placed, wherein the stage includes a first plate, a first temperature adjustment mechanism configured to control a temperature of the first plate, a second plate provided below the first plate, a second temperature adjustment mechanism configured to control a temperature of the second plate, and a fastening member configured to fasten the first plate and the second plate.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
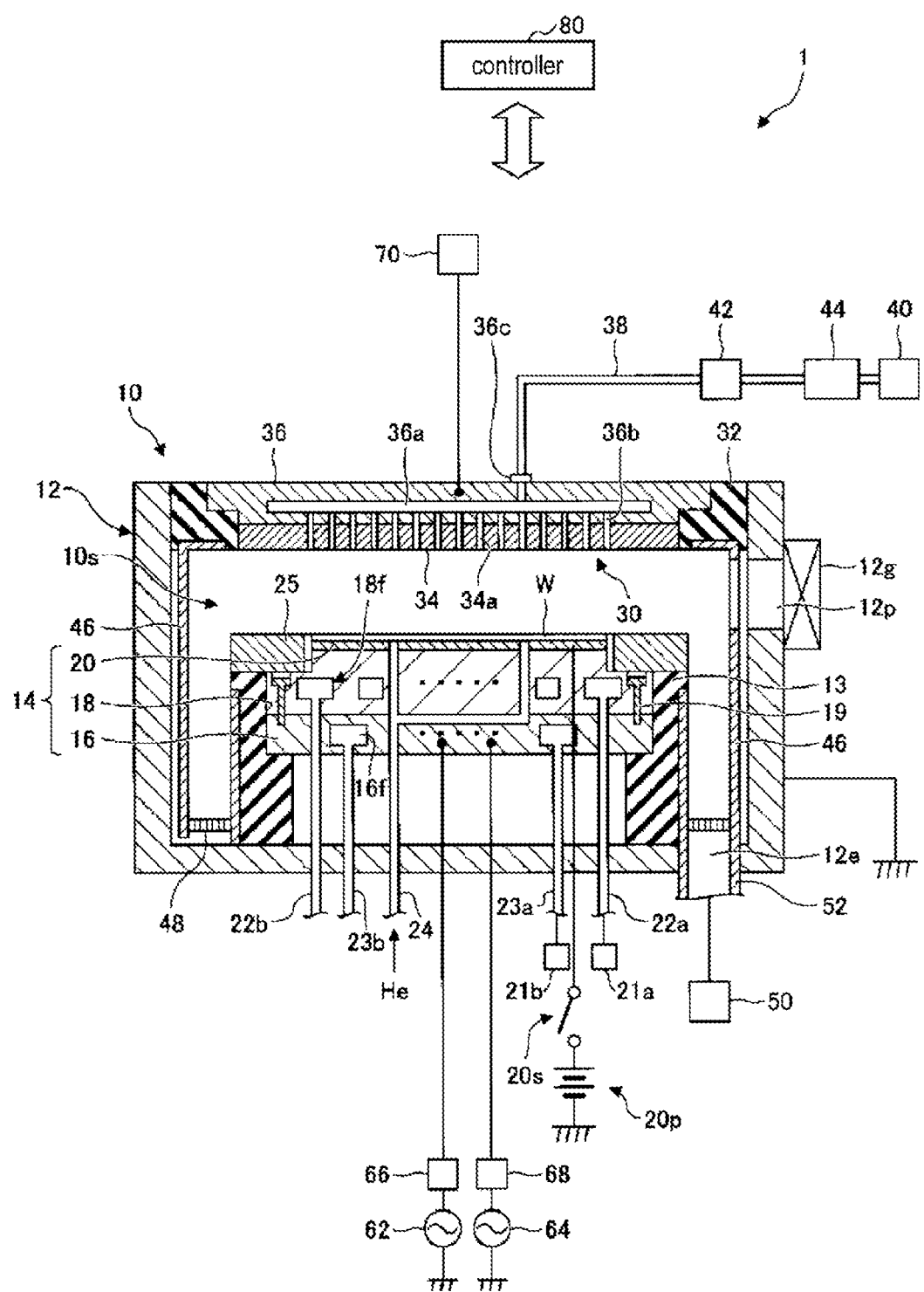
FIG. 1 is a schematic cross-sectional view illustrating an example of a substrate processing apparatus according to an embodiment.

Hereinafter, embodiments of the present disclosure will be described with reference to the accompanying drawings. In each drawing, there may be a case where the same components are designated by like reference numerals with redundant descriptions thereof omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

[Substrate Processing Apparatus]

First, an example of a substrate processing apparatus according to an embodiment will be described with reference to FIG. 1. FIG. 1 is a view illustrating an example of the substrate processing apparatus according to an embodiment. The substrate processing apparatus 1 is a capacitive coupling type of apparatus.

The substrate processing apparatus 1 includes a chamber 10. The chamber 10 provides an inner space 10s therein. The chamber 10 includes a chamber body 12. The chamber body 12 has a substantially cylindrical shape. The inner space 10s is provided inside the chamber body 12. The chamber body 12 is made of, for example, aluminum. A corrosion-resistant film is provided on an inner wall surface of the chamber body 12. The corrosion-resistant film may be an anodized oxide film formed of ceramic, such as alumina (aluminum oxide), yttrium oxide or the like.

A passage 12p is formed in the side wall of the chamber body 12. A substrate W passes through the passage 12p when being transferred between the inner space 10s and the outside of the chamber 10. The passage 12p is configured to be opened/closed by a gate valve 12g. The gate valve 12g is provided along the side wall of the chamber body 12.

A support part 13 is provided on a bottom portion of the chamber body 12. The support part 13 is formed of an insulating material. The support part 13 has a substantially cylindrical shape. The support part 13 extends upward from the bottom portion of the chamber body 12 within the inner space 10s. An edge ring 25 (also referred to as a "focus ring") configured to surround the periphery of the substrate is provided on the support part 13. The edge ring 25 has a substantially cylindrical shape, and may be made of silicon or the like.

The substrate processing apparatus 1 further includes a stage 14. The stage 14 is supported by the support part 13. The stage 14 is provided in the inner space 10s. The stage 14 is configured to support the substrate W within the chamber 10, namely the inner space 10s.

The stage 14 includes a first plate 18 and an electrostatic chuck 20 according to an exemplary embodiment. The stage 14 may further include a second plate 16. The second plate 16 is formed of a conductor such as aluminum or titanium, and has a substantially disk-like shape. The first plate 18 is provided on the second plate 16. The first plate 18 is formed of a conductor such as aluminum or titanium, and has a substantially disk-like shape. The first plate 18 and the second plate 16 may be made of ceramic. In some embodiments, the first plate 18 and the second plate 16 may preferably be made of the same type of metal (conductive member). When each of the first plate 18 and the second plate 16 is made of a conductive member, the friction between the first plate 18 and the second plate 16 becomes larger than that in the case where the plates are made of ceramic. This makes it possible to control deformation of the stage 14 (a substrate placement surface 20a) with enhanced controllability, which will be described later.

The first plate 18 and the second plate 16 are fastened to each other with a screw 19 on the outer circumference of each plate. The screw 19 is an example of a fastening member provided across a contact surface between the first plate 18 and the second plate 16 so as to fasten the first plate 18 and the second plate 16.

The electrostatic chuck 20 is provided on the first plate 18. The electrostatic chuck 20 is fixed to the first plate 18 by an adhesive layer provided between the electrostatic chuck 20 and the first plate 18. An electrode of the electrostatic chuck 20 is connected to a DC power supply 22p via a switch 20s. When a DC voltage is applied to the electrode from the DC power supply 20p, the substrate W is held on the electrostatic chuck 20 by virtue of an electrostatic attractive force. The electrostatic chuck 20 supports the substrate W. Outer peripheral surfaces of the first plate 18 and the second plate 16 are surrounded by the support part 13. In some embodiments, the electrostatic chuck 20 may not be provided on the stage 14.

A first flow path 18f is provided inside the first plate 18. A heat-conductive medium (e.g., coolant) is supplied to the first flow path 18f from a first chiller unit 21a provided outside the chamber 10 through a pipe 22a. The first chiller unit 21a is capable of adjusting a temperature of the heat-conductive medium to a certain temperature. The heat-conductive medium supplied to the first flow path 18f is returned to the first chiller unit 21a via a pipe 22b.

A second flow path 16f is provided inside the second plate 16. A heat-conductive medium (e.g., coolant) is supplied to the second flow path 16f from a second chiller unit 21b provided outside the chamber 10 through a pipe 23a. The second chiller unit 21b is capable of adjusting a temperature of the heat-conductive medium to a certain temperature. The heat-conductive medium supplied to the second flow path 16f is returned to the second chiller unit 21b via a pipe 23b. The first flow path 18f and the second flow path 16f are different flow paths, and the temperature of the heat-conductive medium passing through the first flow path 18f and the temperature of the heat-conductive medium passing through the second flow path 16f may be controlled independently of each other.

The first flow path 18f and the first chiller unit 21a are an example of a first temperature adjustment mechanism included in the first plate 18. The first temperature adjustment mechanism may be at least one of a heater and a Peltier element. The second flow path 16f and the second chiller unit 21b are an example of a second temperature adjustment mechanism included in the second plate 16. The second temperature adjustment mechanism may be at least one of a heater and a Peltier element.

The substrate processing apparatus 1 is provided with a gas supply line 24. The gas supply line 24 supplies a heat-conductive gas (e.g., He gas) from a heat-conductive gas supply mechanism to a gap between an upper surface of the electrostatic chuck 20 and a bottom surface of the substrate W.

The substrate processing apparatus 1 further includes an upper electrode 30. The upper electrode 30 is provided above the stage 14. The upper electrode 30 is supported by an upper portion of the chamber body 12 via a member 32. The member 32 is formed of an insulating material. An upper opening of the chamber body 12 is closed by the upper electrode 30.

The upper electrode 30 may include a ceiling plate 34 and a support 36. A lower surface of the ceiling plate 34 is a surface facing the inner space 10s, and defines the inner space 10s. The ceiling plate 34 may be made of a low-resistance conductor or a semiconductor having low Joule heat. The ceiling plate 34 is provided with a plurality of gas ejection holes 34a. The plurality of gas ejection holes 34a penetrate the ceiling plate 34 in a thickness direction.

The support 36 detachably supports the ceiling plate 34. The support 36 is made of a conductive material such as aluminum. A gas diffusion room 36a is provided inside the support 36. A plurality of gas holes 36b are formed in the support 36. The plurality of gas holes 36b extend downward from the gas diffusion room 36a. The plurality of gas holes 36b communicate with the plurality of gas ejection holes 34a, respectively. A gas introduction port 36c is formed in the support 36. The gas introduction port 36c is connected to the gas diffusion room 36a. A gas supply pipe 38 is connected to the gas introduction port 36c.

A gas supply part including a gas source group 40, a flow controller group 44, and a valve group 42 is connected to the gas supply pipe 38. The gas source group 40 is connected to the gas supply pipe 38 via the flow controller group 44 and the valve group 42. The gas source group 40 includes a plurality of gas sources. The valve group 42 includes a plurality of opening/closing valves. The flow controller group 44 includes a plurality of flow controllers. Each of the plurality of flow controllers of the flow controller group 44 is a mass flow controller or a pressure-controlled flow controller. Each of the plurality of gas sources of the gas source group 40 is connected to the gas supply pipe 38 via a corresponding flow controller of the flow controller group 44 and a corresponding opening/closing valve of the valve group 42. A power supply 70 is connected to the upper electrode 30. The power supply 70 applies, to the upper electrode 30, a voltage for drawing positive ions present in the inner space 10s to the ceiling plate 34.

In the substrate processing apparatus 1, a shield 46 is detachably installed along the inner wall surface of the chamber body 12. The shield 46 is also provided on the outer periphery of the support part 13. The shield 46 prevents reaction products, such as etching byproducts, from adhering to the chamber body 12. The shield 46 is constituted by forming a corrosion-resistant film on an upper surface of a member formed of, for example, aluminum. The corrosion-resistant film may be an oxide film such as an alumina film or an yttrium oxide film.

A baffle plate 48 is provided between the support part 13 and the side wall of the chamber body 12. The baffle plate 48 is constituted by forming a corrosion-resistant film on an upper surface of a member formed of, for example, aluminum. The corrosion-resistant film may be an oxide film such as an alumina film or an yttrium oxide film. A plurality of through-holes are formed in the baffle plate 48. An exhaust port 12e is provided below the baffle plate 48 and in the bottom portion of the chamber body 12. An exhaust device 50 is connected to the exhaust port 12e via an exhaust pipe 52. The exhaust device 50 includes a pressure regulation valve and a vacuum pump such as a turbo molecular pump.

The substrate processing apparatus 1 includes a first radio-frequency power supply 62 configured to apply radio-frequency (HF) power for plasma generation. The first radio-frequency power supply 62 is configured to generate the radio-frequency (HF) power in order to generate plasma from gas inside the chamber 10. The frequency of the radio frequency (HF) is, for example, a frequency in a range of 27 MHz to 100 MHz.

The first radio-frequency power supply 62 is electrically connected to the first plate 18 via a matcher 66. The matcher 66 includes a matching circuit. The matching circuit of the matcher 66 is configured to match a load-side impedance (impedance on the side of the stage 14) of the first radio-frequency power supply 62 with an output impedance of the first radio-frequency power supply 62. In another embodiment, the first radio-frequency power supply 62 may be electrically connected to the upper electrode 30 via the matcher 66.

The substrate processing apparatus 1 may further include a second radio-frequency power supply 64 configured to apply radio-frequency (LF) power for ion attraction. The second radio-frequency power supply 64 is configured to generate the radio-frequency (LF) power. The radio frequency (LF) mainly has a frequency suitable for drawing ions into the substrate W, and is, for example, a frequency in a range of 400 kHz to 13.56 MHz. Alternatively, the radio frequency (LF) may be a pulsed voltage having a rectangular waveform.

The second radio-frequency power supply 64 is electrically connected to the first plate 18 via a matcher 68. The matcher 68 includes a matching circuit. The matching circuit of the matcher 68 is configured to match a load-side impedance (impedance on the side of the stage 14) of the second radio-frequency power supply 64 with an output impedance of the second radio-frequency power supply 64.

The substrate processing apparatus 1 may further include a controller 80. The controller 80 may be a computer including, for example, a processor, a storage part such as a memory, an input device, a display device, a signal input/output interface, and the like. The controller 80 controls each part of the substrate processing apparatus 1. In the controller 80, an operator can perform, for example, a command input operation using the input device in order to manage the substrate processing apparatus 1. In addition, the controller 80 controls the display device to visually display the operating situation of the substrate processing apparatus 1 thereon. In addition, a control program and recipe data are stored in the storage part of the controller 80. The control program is executed by the processor of the controller 80 in order to execute various processes in the substrate processing apparatus 1. Various processes such as a plasma processing method and the like are executed when the processor of the controller 80 controls each part of the substrate processing apparatus 1 according to the recipe data by executing the control program.

The controller 80 controls the first chiller unit 21a connected to the first flow path 18f in the first plate 18 and the second chiller unit 21b connected to the second flow path 16f in the second plate 16. The temperature of the substrate W is adjusted through heat exchange between the heat-conductive medium flowing through the first flow path 18f and the first plate 18, and heat exchange between the heat-conductive medium flowing through the second flow path 16f and the second plate 16. In addition, the temperature of the substrate W is adjusted through heat exchange between the first plate 18 and the second plate 16 and heat exchange between the first plate 18 and the electrostatic chuck 20.

In the stage 14 configured as described above, by providing the second flow path 16f in the second plate 16 in addition to providing the first flow path 18f in the first plate 18, it is possible to separately control the temperature of the first plate 18 and the temperature of the second plate 16. This makes it possible to positively control the deformation of the stage 14. The control of the deformation of the stage 14 also includes a control for flattening the stage 14.

[Shape Control of Stage]

An example of shape control of the stage 14 according to the embodiment through temperature control of the stage 14 will be described with reference to FIGS. 2A and 2B and FIGS. 3A and 3B. FIGS. 2A and 2B and FIGS. 3A and 3B are views each illustrating an example of temperature control of the stage 14 according to the embodiment. The screws 19 in FIGS. 2A and 2B and FIGS. 3A and 3B are screwed with screw holes 19b formed in the upper surface of the outer circumference of the second plate 16 through the through-holes 19a formed in the outer circumference of the first plate 18 and penetrating the first plate 18. The first plate 18 and the second plate 16 are fastened to each other by screwing the first plate 18 and the second plate 16 across a contact surface between the first plate 18 and the second plate 16 with the screws 19. In some embodiments, the first plate 18 and the second plate 16 may be screwed with each other by forming through-holes in the second plate 16 and forming screw holes in the bottom surface of the first plate 18.

The first plate 18 and the second plate 16 are firmly fastened to each other with the screws 19. Therefore, when a temperature change occurs in the first plate 18 or the second plate 16, thermal stress is generated in the first plate 18 or the second plate 16.

Figure 2A:
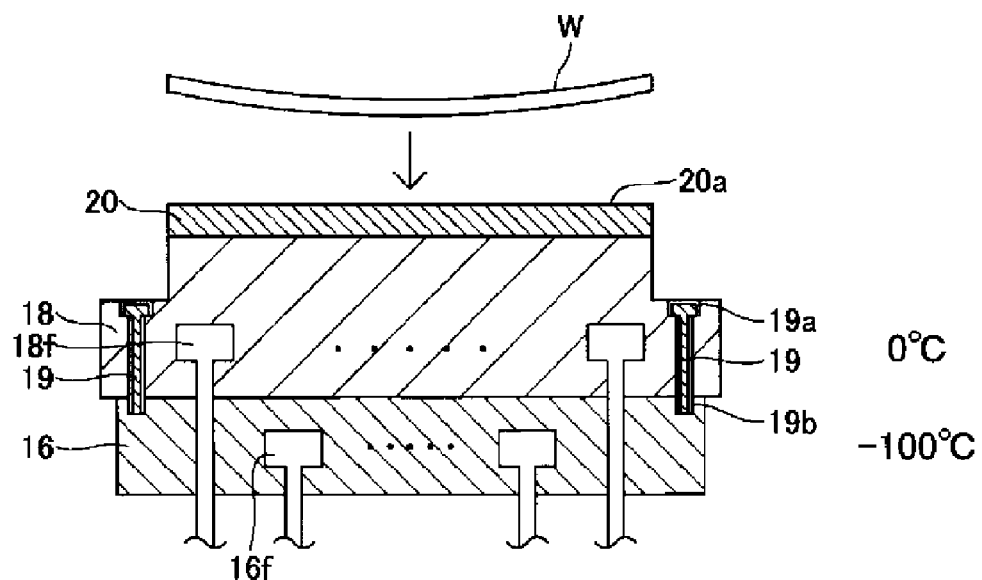
FIGS. 2A and 2B are views illustrating an example of temperature control of a stage according to an embodiment.

For example, as illustrated in FIG. 2A, the temperature of the first plate 18 is controlled by controlling the temperature of the heat-conductive medium flowing through the first flow path 18f to 0 degrees C., and the temperature of the second plate 16 is controlled by controlling the temperature of the heat-conductive medium flowing through the second flow path 16f to −100 degrees C. Subsequently, as illustrated in FIG. 2B, the temperature of the second plate 16 is controlled by controlling the temperature of the heat-conductive medium flowing through the second flow path 16f to 100 degrees C. while maintaining the temperature of the heat-conductive medium flowing through the first flow path 18f at 0 degrees C.

Figure 2B:
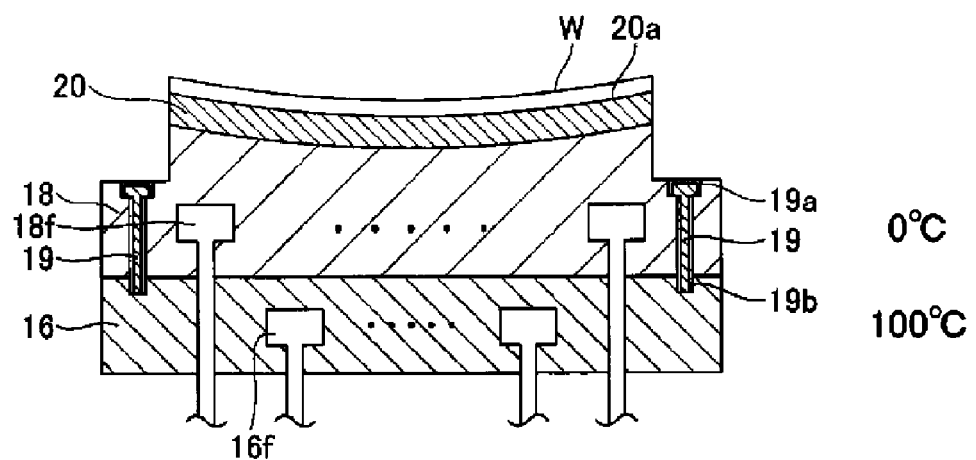

When the state of FIG. 2A is transitioned to the state of FIG. 2B in this way, the temperature of the second plate 16 changes from −100 degrees C. to 100 degrees C., and the temperature of the first plate 18 remains unchanged at 0 degrees C. Therefore, the second plate 16 expands more than the first plate 18 in the vertical and horizontal directions. The first plate 18 and the second plate 16 are firmly fastened to each other with the screws 19. Therefore, the horizontal expansion of the second plate 16 is hindered, and thermal stress (compressive stress) is generated in the second plate 16. Further, along with this, tensile stress is generated in the first plate 18, and the electrostatic chuck 20 and the first plate 18 are deformed concavely toward the substrate placement surface 20a.

Figure 3A:
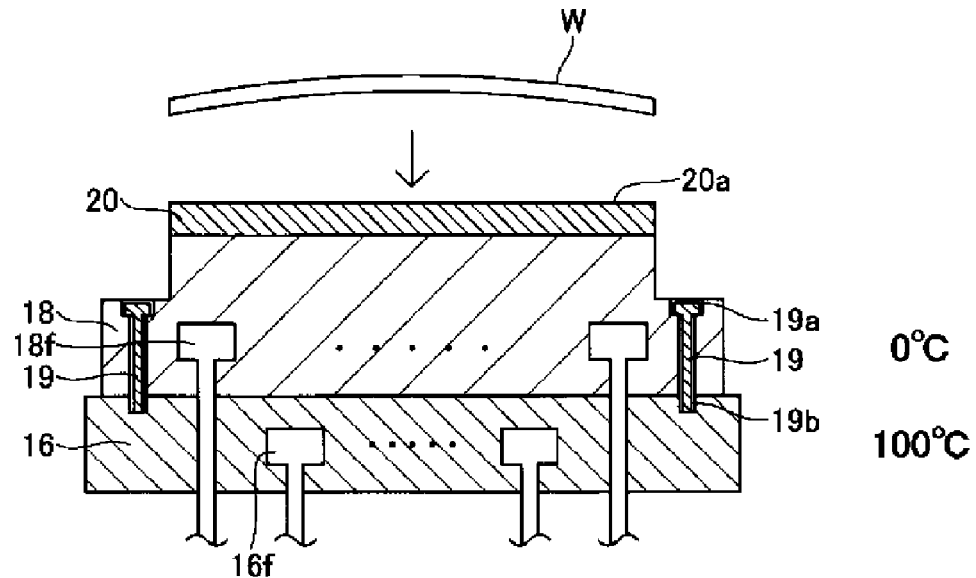
FIGS. 3A and 3B are views illustrating an example of temperature control of the stage according to an embodiment.

Next, the temperature control when the electrostatic chuck 20 is deformed convexly toward the side of the substrate placement surface 20a will be described with reference to FIGS. 3A and 3B. As illustrated in FIG. 3A, the temperature of the first plate 18 is controlled by controlling the temperature of the heat-conductive medium flowing through the first flow path 18f to 0 degrees C., and the temperature of the second plate 16 is controlled by controlling the temperature of the heat-conductive medium flowing through the second flow path 16f to 100 degrees C. Subsequently, as illustrated in FIG. 3B, the temperature of the second plate 16 is controlled by controlling the temperature of the heat-conductive medium flowing through the second flow path 16f to −100 degrees C. while maintaining the temperature of the heat-conductive medium flowing through the first flow path 18f at 0 degrees C.

Figure 3B:
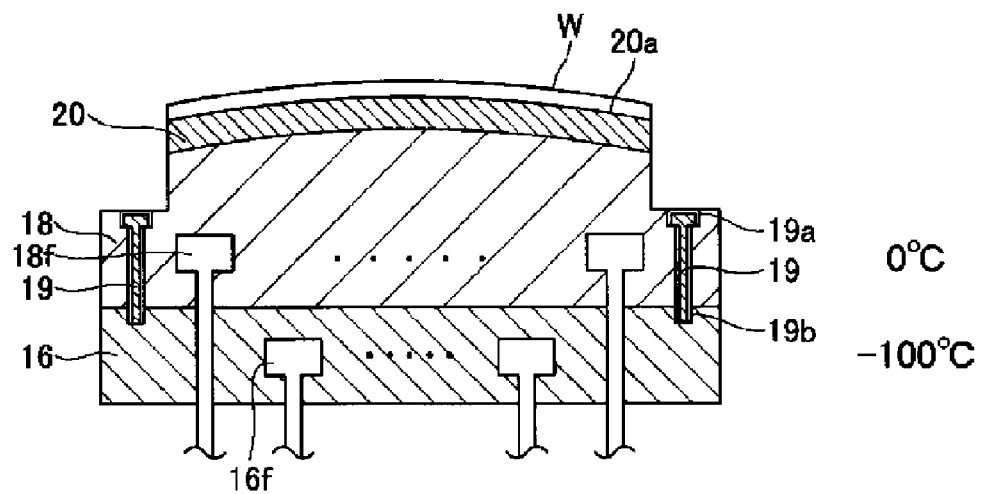

When the state of FIG. 3A is transitioned to the state of FIG. 3B in this way, the temperature of the second plate 16 changes from 100 degrees C. to −100 degrees C., and the temperature of the first plate 18 remains unchanged at 0 degrees C. Therefore, the second plate 16 contracts more in the vertical and horizontal directions than the first plate 18. The first plate 18 and the second plate 16 are firmly fastened to each other with the screws 19. Therefore, the horizontal contraction of the second plate 16 is hindered, and thermal stress (tensile stress) is generated in the second plate 16. Further, along with this, compressive stress is generated in the first plate 18, and the electrostatic chuck 20 and the first plate 18 are deformed convexly toward the side of the substrate placement surface 20a. This makes it possible to positively warp the stage 14 in the warpage direction of the substrate W according to the warp of the substrate W.

In addition, since the first plate 18 and the second plate 16 are firmly fastened to each other with the screws 19, a strong frictional force is generated between the bottom surface of the first plate 18 and the upper surface of the second plate 16. However, when the temperature of the first plate 18 or the second plate 16 is changed rapidly, tensile stress (or compressive stress) stronger than the frictional force is rapidly generated, and thus slippage occurs. For this reason, deformation of the first plate 18 or the second plate 16 may not occur. Therefore, in order to control the deformation of the substrate placement surface 20a, it is desirable to control the temperature of the first plate 18 or the second plate 16 within a range in which strong thermal stress is not generated. Specifically, it is desirable to raise or lower the temperature such that a difference in temperature change between the first plate 18 and the second plate 16 is 3 degrees C./min or less.

As described above, in this embodiment, it is possible to positively control the deformation of the stage 14 by controlling the temperature of the heat-conductive medium flowing through the second flow path 16f. For example, when it is desired to warp the stage 14 in the same direction as the warpage direction of the substrate W, the warpage of the substrate W may be measured, and the stage 14 may be positively warped in the warpage direction of the substrate W according to the measurement result.

In this embodiment, the temperature of the heat-conductive medium flowing through the first flow path 18f is not changed. That is, it is possible to freely control the shape of the substrate placement surface 20a by changing the temperature of the second plate 16 while fixing the temperature of the first plate 18 at a temperature suitable for the process.

The temperature control method according to an embodiment includes a step of measuring the shape of the substrate W and a step of controlling the temperature of the heat-conductive medium flowing through the second flow path 16f of the second plate 16 based on the measured shape of the substrate W. With this temperature control method, it is possible to positively control the deformation of the stage 14 according to the shape of the substrate W by providing a temperature adjustment mechanism in both the first plate 18 and the second plate 16. This makes it possible to improve the controllability of the temperature of the substrate W by deforming the substrate placement surface 20a of the electrostatic chuck 20 in the warpage direction of the substrate W so as to improve the adhesion between the substrate W and the electrostatic chuck 20. This makes it possible to reduce the in-plane temperature distribution of the substrate W, and thus to improve etching characteristics (e.g., an etching rate) on the substrate W. As for the shape of the substrate W, the warpage of the substrate W placed on a transfer arm may be measured from the state of reflected light of a laser beam, may be estimated by measuring the state of the contact surface of the substrate W placed on the transfer arm, or may be measured using another known method.

[Shape Control of Stage (Other Examples)]

Next, another example of shape control through the temperature control of the stage 14 according to an embodiment will be described with reference to FIGS. 4A to 4D and FIGS. 5A to 5D. FIGS. 4A to 4D and FIGS. 5A to 5D are views illustrating another example of the temperature control of the stage 14 according to an embodiment.

Figure 4A:
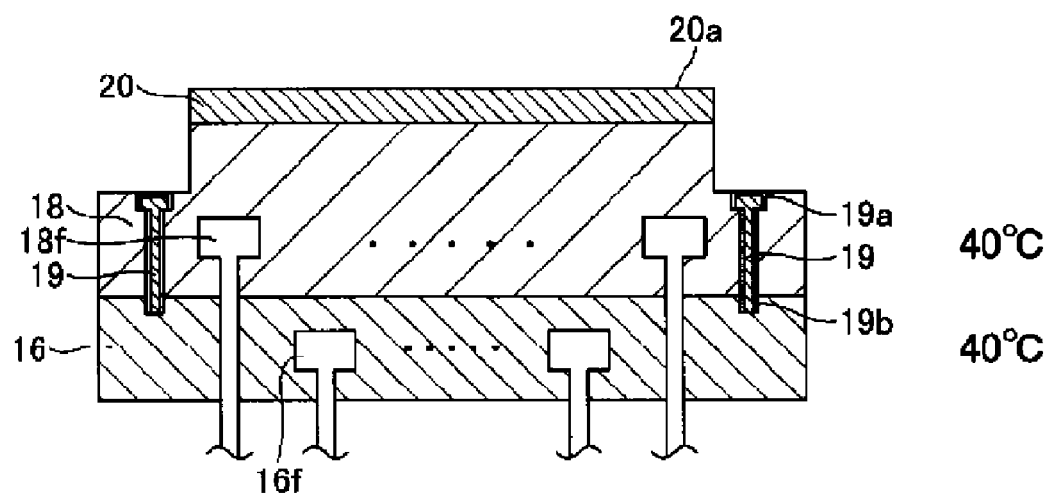
FIGS. 4A to 4D are views illustrating another example of temperature control of the stage according to an embodiment.
Figure 4B:
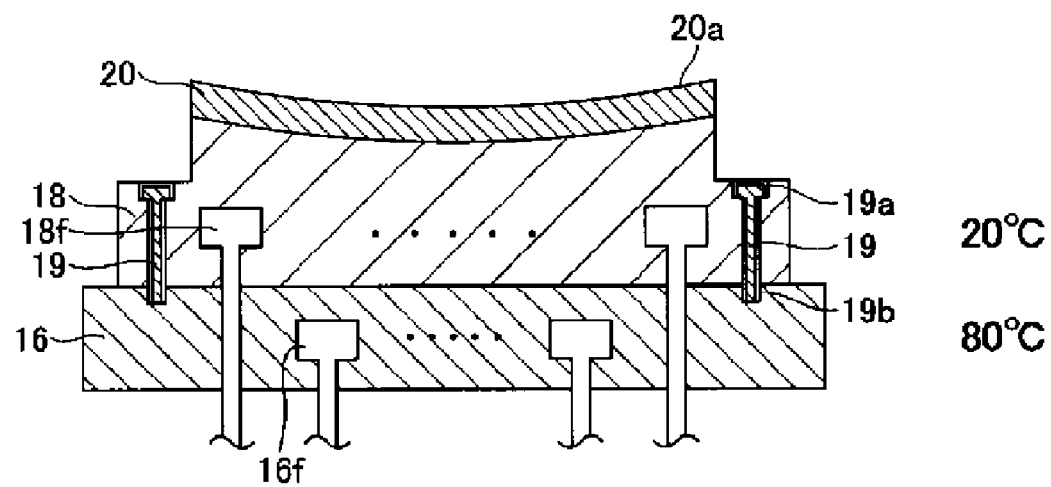
Figure 4C:
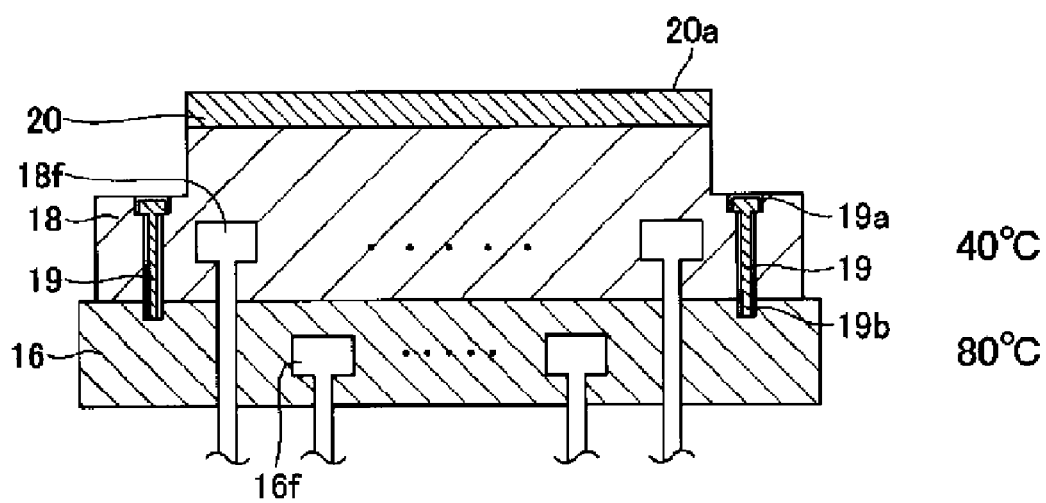
Figure 4D:
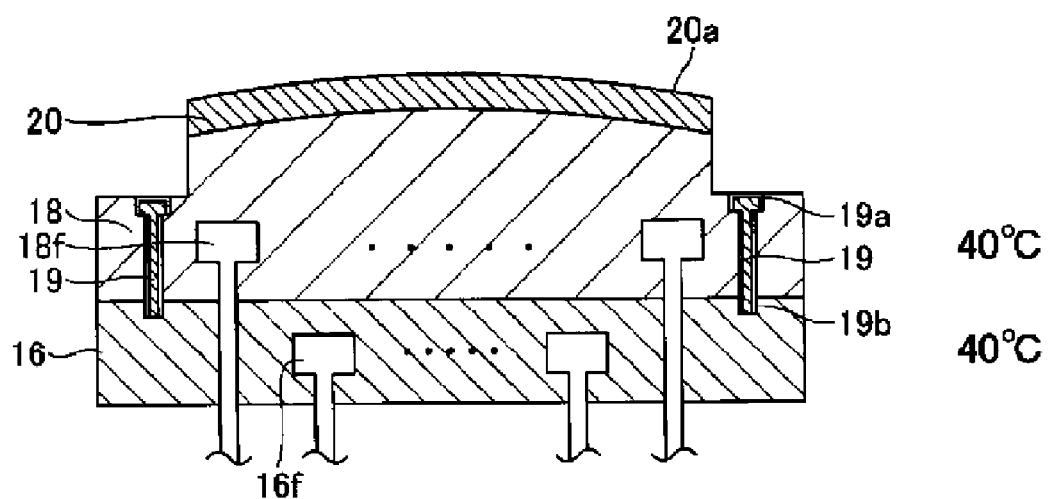

For example, as illustrated in FIG. 4A, the temperature of the first plate 18 is controlled by controlling the temperature of the heat-conductive medium flowing through the first flow path 18f to 40 degrees C., and the temperature of the second plate 16 is controlled by controlling the temperature of the heat-conductive medium flowing through the second flow path 16f to 40 degrees C. At this time, the substrate placement surface 20a is in a flat state. Subsequently, as illustrated in FIG. 4B, the temperature of the first plate 18 is controlled by controlling the temperature of the heat-conductive medium flowing through the first flow path 18f to 20 degrees C., and the temperature of the second plate 16 is controlled by controlling the temperature of the heat-conductive medium flowing through the second flow path 16f to 80 degrees C. Subsequently, as illustrated in FIG. 4C, the temperature of the first plate 18 is controlled by controlling the temperature of the heat-conductive medium flowing through the first flow path 18f to 40 degrees C. while maintaining the temperature of the heat-conductive medium flowing through the second flow path 16f at 80 degrees C. Then, as illustrated in FIG. 4D, the temperature of the second plate 16 is controlled by controlling the temperature of the heat-conductive medium flowing through the second flow path 16f to 40 degrees C. while maintaining the temperature of the heat-conductive medium flowing through the first flow path 18f at 40 degrees C.

As illustrated in FIG. 4A, the temperature of the first plate 18 and the temperature of the second plate 16 are controlled to be the same temperature. At this time, the substrate placement surface 20a is in a flat state. From this state, as illustrated in FIG. 4B, the temperature of the first plate 18 is lowered from 40 degrees C. to 20 degrees C. In addition, the temperature of the second plate 16 is raised from 40 degrees C. to 80 degrees C. As a result, the first plate 18 contracts, and the second plate 16 expands. In addition, the first plate 18 and the second plate 16 are firmly fastened to each other with the screws 19. Therefore, the horizontal expansion of the second plate 16 is hindered, and thermal stress (compressive stress) is generated in the second plate 16. Further, along with this, tensile stress is generated in the first plate 18. In addition, the horizontal contraction of the first plate 18 is hindered, and thermal stress (tensile stress) is generated in the first plate 18. As a result, the electrostatic chuck 20 and the first plate 18 are deformed concavely toward the substrate placement surface 20a.

Subsequently, as illustrated in FIG. 4C, the temperature of the first plate 18 is controlled by controlling the temperature of the heat-conductive medium flowing through the first flow path 18f to 40 degrees C. while maintaining the temperature of the heat-conductive medium flowing through the second flow path 16f at 80 degrees C.

In this case, since the temperature of the first plate 18 is higher than that in the state illustrated in FIG. 4B, the first plate 18 expands. The first plate 18 and the second plate 16 are firmly fastened to each other with the screws 19. Therefore, the horizontal expansion of the first plate 18 is hindered, and thermal stress (compressive stress) is generated in the first plate 18. As a result, the electrostatic chuck 20 and the first plate 18 are deformed convexly toward the side of the substrate placement surface 20a. In the state illustrated in FIG. 4B, since the electrostatic chuck 20 and the first plate 18 are deformed concavely toward the substrate placement surface 20a, in the state illustrated in FIG. 4C, the substrate placement surface 20a is in a substantially flat state.

Subsequently, as illustrated in FIG. 4D, the temperature of the second plate 16 is controlled by controlling the temperature of the heat-conductive medium flowing through the second flow path 16f to 40 degrees C. while maintaining the temperature of the heat-conductive medium flowing through the first flow path 18f at 40 degrees C.

In this case, since the temperature of the second plate 16 is lower than that in the state illustrated in FIG. 4C, the second plate 16 contracts. The first plate 18 and the second plate 16 are firmly fastened to each other with the screws 19. Therefore, the horizontal contraction of the second plate 16 is hindered, and thermal stress (tensile stress) is generated in the second plate 16. Further, along with this, compressive stress is generated in the first plate 18, and the electrostatic chuck 20 and the first plate 18 are deformed convexly toward the side of the substrate placement surface 20a.

Figure 5A:
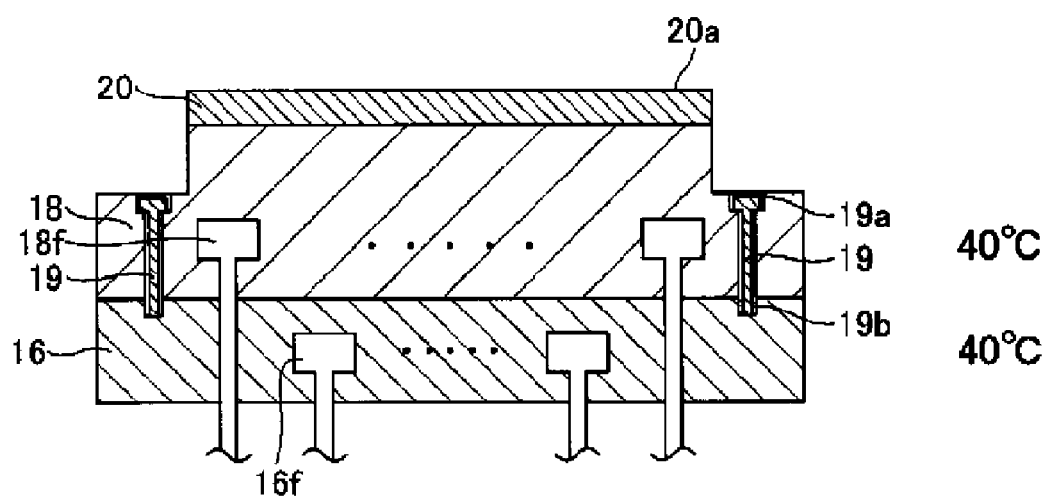
FIGS. 5A to 5D are views illustrating another example of temperature control of the stage according to an embodiment.
Figure 5B:
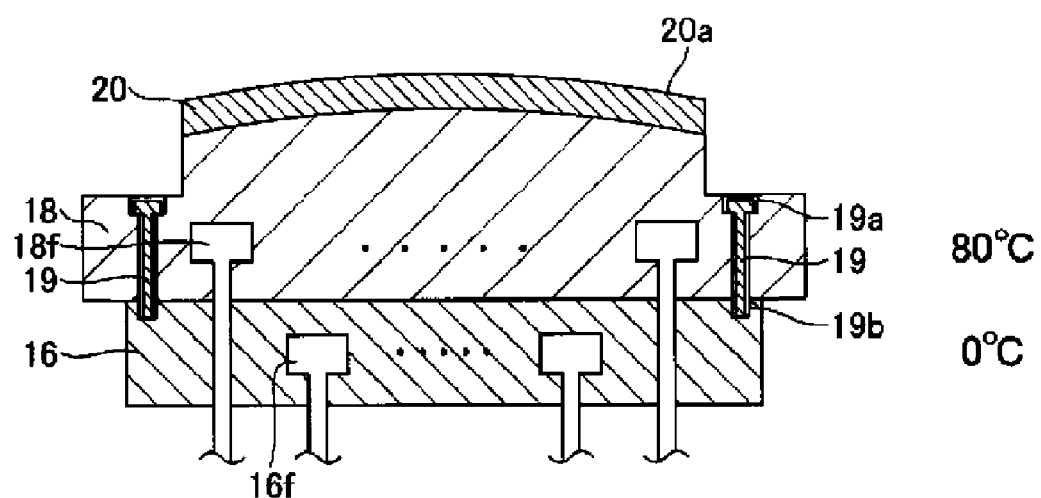
Figure 5C:
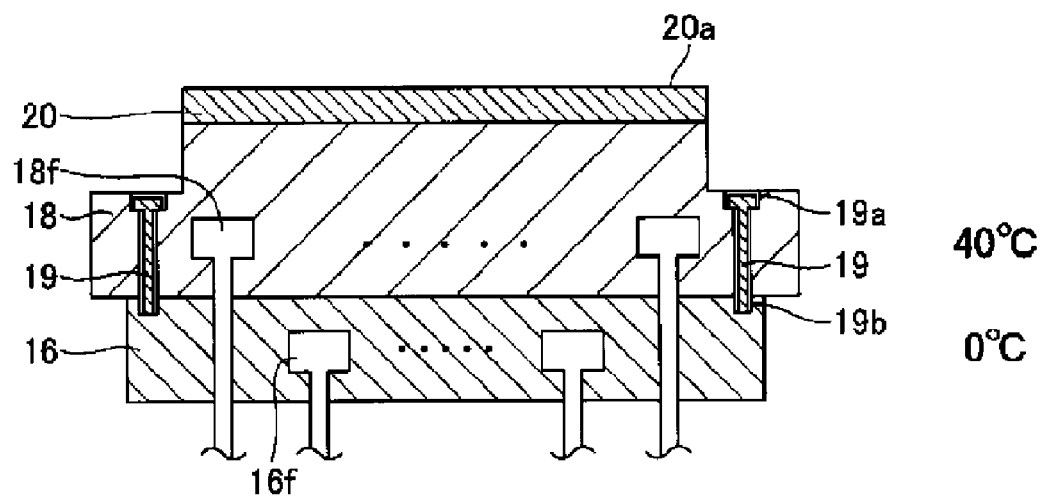
Figure 5D:
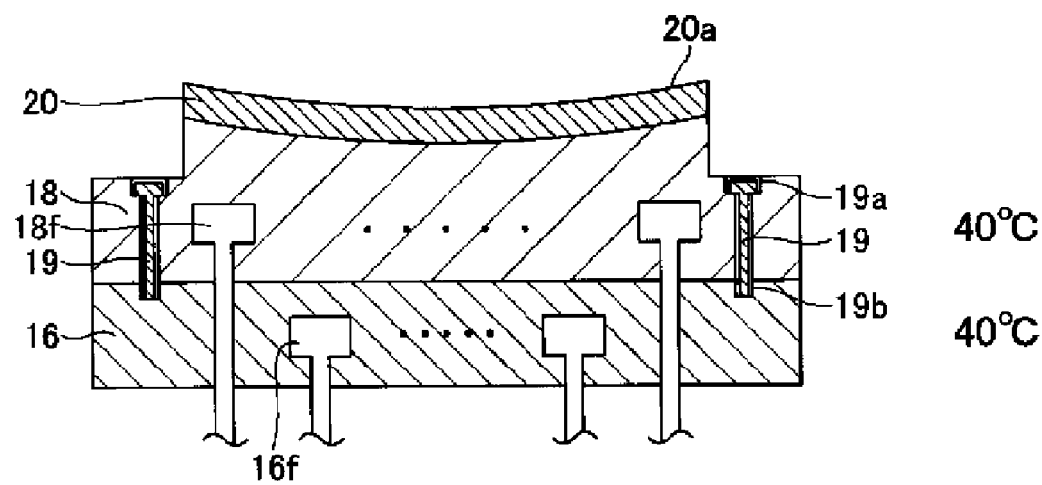

Next, the temperature control in the case in which the electrostatic chuck 20 is deformed convexly toward the side of the substrate placement surface 20a will be described with reference to FIGS. 5A to 5D. As illustrated in FIG. 5A, the temperature of the first plate 18 is controlled by controlling the temperature of the heat-conductive medium flowing through the first flow path 18f to 40 degrees C., and the temperature of the second plate 16 is controlled by controlling the temperature of the heat-conductive medium flowing through the second flow path 16f to 40 degrees C. At this time, the substrate placement surface 20a is in a flat state. Subsequently, as illustrated in FIG. 5B, the temperature of the first plate 18 is controlled by controlling the temperature of the heat-conductive medium flowing through the first flow path 18f to 80 degrees C., and the temperature of the second plate 16 is controlled by controlling the temperature of the heat-conductive medium flowing through the second flow path 16f to 0 degrees C. Subsequently, as illustrated in FIG. 5C, the temperature of the first plate 18 is controlled by controlling the temperature of the heat-conductive medium flowing through the first flow path 18f to 40 degrees C. while maintaining the temperature of the heat-conductive medium flowing through the second flow path 16f at 0 degrees C. Then, as illustrated in FIG. 5D, the temperature of the second plate 16 is controlled by controlling the temperature of the heat-conductive medium flowing through the second flow path 16f to 40 degrees C. while maintaining the temperature of the heat-conductive medium flowing through the first flow path 18f at 40 degrees C.

As illustrated in FIG. 5A, the temperature of the first plate 18 and the temperature of the second plate 16 are controlled to be the same temperature. In addition, the substrate placement surface 20a is in a flat state. From this state, as illustrated in FIG. 5B, the temperature of the first plate 18 is raised from 40 degrees C. to 80 degrees C. In addition, the temperature of the second plate 16 is lowered from 40 degrees C. to 0 degrees C. The first plate 18 expands, and the second plate 16 contracts. In addition, the first plate 18 and the second plate 16 are firmly fastened to each other with the screws 19. Therefore, the horizontal contraction of the second plate 16 is hindered, and thermal stress (tensile stress) is generated in the second plate 16. Further, along with this, compressive stress is generated in the first plate 18. In addition, the horizontal expansion of the first plate 18 is hindered, and thermal stress (compressive stress) is generated in the first plate 18. As a result, the electrostatic chuck 20 and the first plate 18 are deformed convexly toward the side of the substrate placement surface 20a.

Subsequently, as illustrated in FIG. 5C, the temperature of the first plate 18 is controlled by controlling the temperature of the heat-conductive medium flowing through the first flow path 18f to 40 degrees C. while maintaining the temperature of the heat-conductive medium flowing through the second flow path 16f at 0 degrees C.

In this case, since the temperature of the first plate 18 is lower than that in the state illustrated in FIG. 5B, the first plate 18 contracts. The first plate 18 and the second plate 16 are firmly fastened to each other with the screws 19. Therefore, the horizontal contraction of the first plate 18 is hindered, and thermal stress (tensile stress) is generated in the first plate 18. As a result, the electrostatic chuck 20 and the first plate 18 are deformed concavely toward the substrate placement surface 20a. In the state illustrated in FIG. 5B, since the electrostatic chuck 20 and the first plate 18 are deformed convexly toward the side of the substrate placement surface 20a, in the state illustrated in FIG. 5C, the substrate placement surface 20a is in a substantially flat state.

Subsequently, as illustrated in FIG. 5D, the temperature of the second plate 16 is controlled by controlling the temperature of the heat-conductive medium flowing through the second flow path 16f to 40 degrees C. while maintaining the temperature of the heat-conductive medium flowing through the first flow path 18f at 40 degrees C.

In this case, since the temperature of the second plate 16 is higher than that in the state illustrated in FIG. 5C, the second plate 16 expands. The first plate 18 and the second plate 16 are firmly fastened to each other with the screws 19. Therefore, the horizontal expansion of the second plate 16 is hindered, and thermal stress (compressive stress) is generated in the second plate 16. Further, along with this, compressive stress is generated in the first plate 18, and the electrostatic chuck 20 and the first plate 18 are deformed concavely toward the substrate placement surface 20a.

Further, in FIG. 4B, in order to make the substrate placement surface 20a concave, the temperature of the second plate 16 is raised and the temperature of the first plate 18 is lowered. However, the temperatures of both the first plate 18 and the second plate 16 may be raised so as to make both the first plate 18 and the second plate 16 concave. For example, the temperature of the first plate 18 may be raised from 40 degrees C. to 60 degrees C., and the temperature of the second plate 16 may be raised from 40 degrees C. to 80 degrees C. In this case, since the temperature change of the second plate 16 is greater than the temperature change of the first plate 18, the second plate 16 expands more than the first plate 18. Therefore, the horizontal expansion of the second plate 16 is hindered, and thermal stress (compressive stress)

is generated in the second plate 16. Further, along with this, tensile stress is generated in the first plate 18. This makes it possible to make the substrate placement surface 20a concave. In addition, the temperature of the first plate 18 may not be changed and only the temperature of the second plate 16 may be raised, or the temperature of the second plate 16 may not be changed and only the temperature of the first plate 18 may be lowered.

In addition, in order to make the substrate placement surface 20a convex, the temperatures of the first plate 18 and the second plate 16 may be raised such that the temperature change of the first plate 18 is greater than the temperature change of the second plate 16. The temperature of the first plate 18 may not be changed and only the temperature of the second plate 16 may be lowered, or the temperature of the second plate 16 may not be changed and only the temperature of the first plate 18 may be raised.

As described above, in this embodiment, it is possible to positively control the deformation of the stage 14 by controlling the temperature of the heat-conductive medium in the first flow path 18f and/or the temperature of the heat-conductive medium in the second flow path 16f. That is, the temperature changes of the first plate 18 and the second plate 16 may be combined. As a result, by controlling the temperatures of the first plate 18 and the second plate 16 to the same temperature as that in the initial state (FIG. 4A or FIG. 5A), it is also possible to change the shape of the substrate placement surface 20a (FIG. 4D or in FIG. 5D). In the examples of FIGS. 4A to 4D and FIGS. 5A to 5D, the shape of the substrate placement surface 20a in the initial state is flat, but may be concave or convex. That is, by changing the temperatures of the first plate 18 and the second plate 16 depending on the shape of the substrate placement surface 20a in the initial state, it is possible to arbitrarily change the shape of the substrate placement surface 20a regardless of the temperatures of the first plate 18 and the second plate 16.

Various controls are possible in the temperature control of the heat-conductive medium flowing through the first flow path 18f and the heat-conductive medium flowing through the second flow path 16f described above. For example, the controller 80 may control the temperatures of the heat-conductive medium flowing through the first flow path 18f and the heat-conductive medium flowing through the second flow path 16f such that the first plate 18 and the second plate 16 have the same temperature at the same timing. This makes it possible for the first plate 18 and the second plate 16 to have the same temperature at the same timing. Therefore, the stage 14 is not deformed due to a difference in thermal stress between the first plate 18 and the second plate 16. Further, when only such a control is performed, the first chiller unit 21a and the second chiller unit 21b may be the same chiller unit. That is, the first chiller unit 21a may be connected to the first flow path 18f and the second flow path 16f, and the second chiller unit 21b may be omitted.

[Temperature Control Method]

Figure 6:
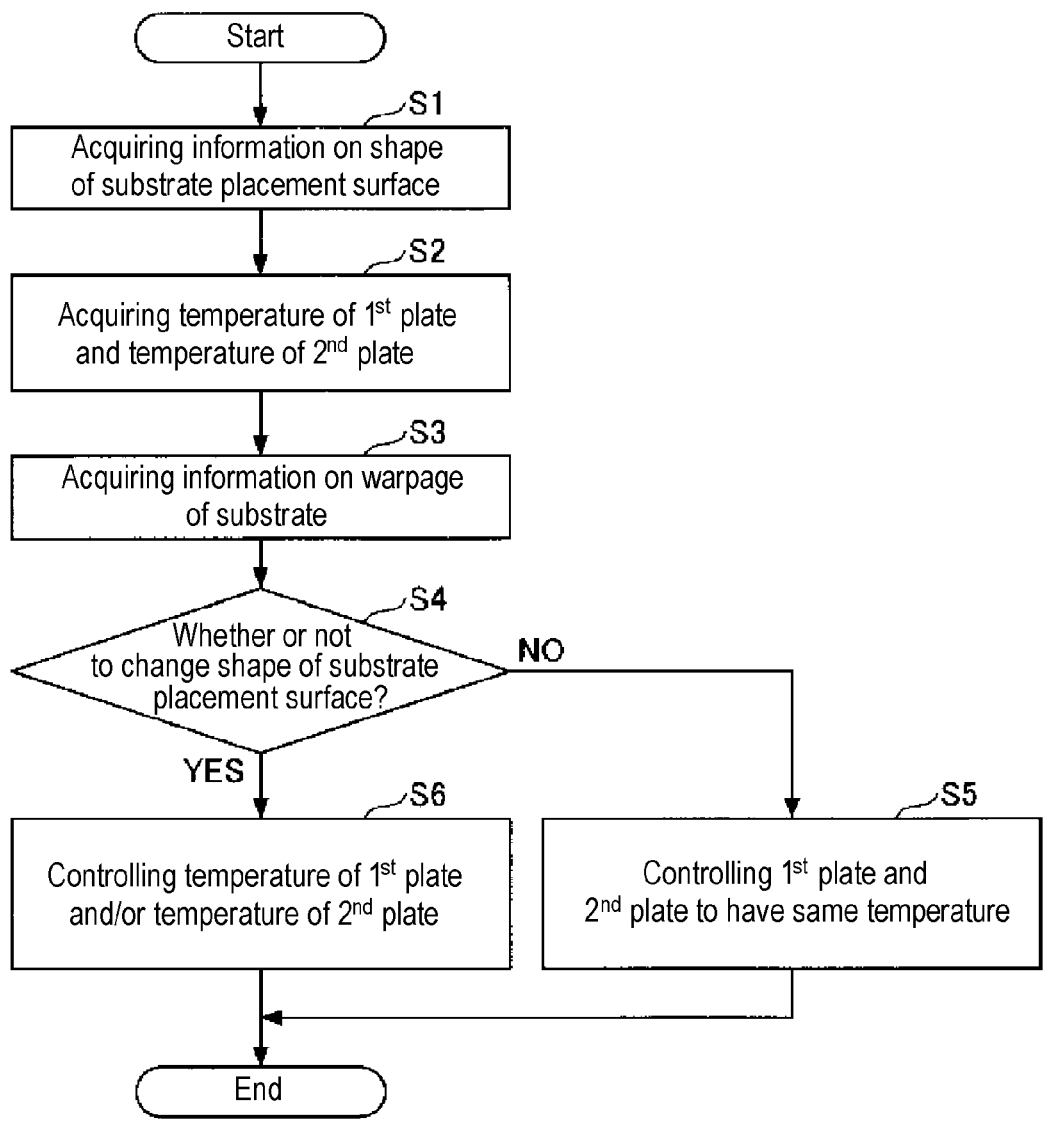
FIG. 6 is a view illustrating an example of a temperature control method according to an embodiment.

Next, a temperature control method according to an embodiment will be described with reference to FIG. 6. FIG. 6 is a view illustrating an example of the temperature control method according to an embodiment.

When this process is started, the controller 80 acquires information on the shape of the substrate placement surface 20a (step S1). The information on the shape of the substrate placement surface 20a may be acquired by measurement using a sensor. In addition, the information on the shape may be acquired referring to histories of temperature changes of the first plate 18 and the second plate 16 stored in the storage part, and information indicating a correlation between the temperature changes of the first plate 18 and the second plate 16 and a change in the shape of the first plate 18.

Subsequently, the controller 80 acquires the temperature of the first plate 18 and the temperature of the second plate 16 (step S2). The temperature of the first plate 18 and the temperature of the second plate 16 may be the temperature of the heat-conductive medium flowing through the first flow path 18f and the temperature of the heat-conductive medium flowing through the second flow path 16f, respectively. In addition, the temperatures may be measured by temperature sensors provided on the first plate 18 and the second plate 16, respectively.

Subsequently, the controller 80 acquires information on the warpage of the substrate W (step S3). As the information on the warpage of the substrate W, information measured by a measurement device different from the substrate processing apparatus 1 may be used, or information measured by a measurement part provided inside the substrate processing apparatus 1 may be used.

Subsequently, the controller 80 determines whether or not to change the shape of the stage 14 (the substrate placement surface 20a) (step S4). Whether or not to change the shape of the stage 14 may be determined based on the information on the shape of the substrate placement surface 20a acquired in step S1 and the information on the warpage of the substrate W acquired in step S3.

In step S4, when the controller 80 determines that the shape of the stage 14 is not to be changed, the controller 80 controls the first plate 18 and the second plate 16 to have the same temperature (step S5), and ends this process. That is, the temperature of the heat-conductive medium flowing through the first flow path 18f and the temperature of the heat-conductive medium flowing through the second flow path 16f are controlled to be the same temperature or a predetermined temperature in consideration of heat input from the plasma so that no temperature difference occurs between the first plate 18 and the second plate 16.

When the controller 80 determines in step S4 that the shape of the stage 14 is to be changed, the controller 80 controls the temperature of the first plate 18 and/or the temperature of the second plate 16 (step S6), and ends this process. After step S6, whether or not the substrate mounting surface 20a has been deformed into a desired shape may be checked by using a sensor.

[Shape Measurement]

Figure 7A:
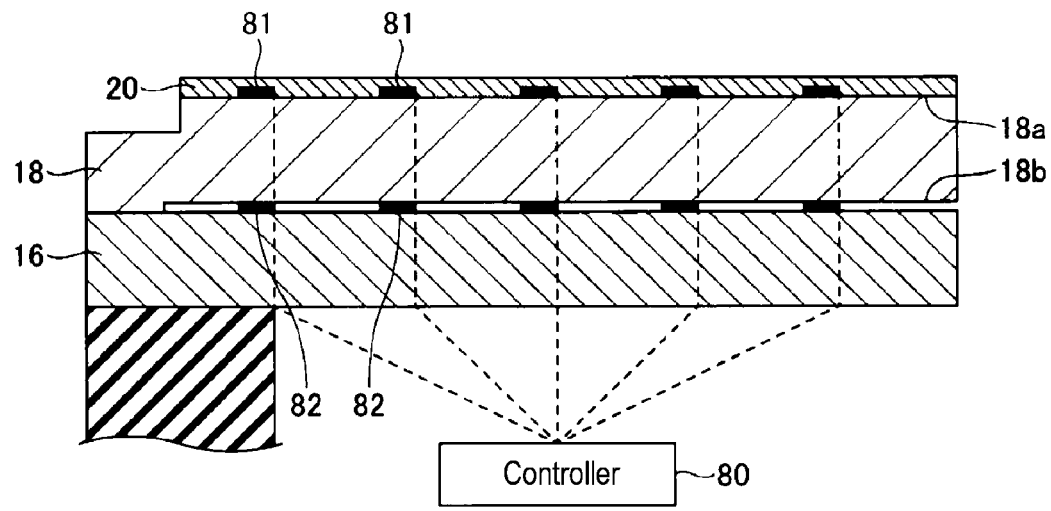
FIGS. 7A and 7B are views illustrating exemplary arrangements of a plurality of sensors according to an embodiment.
Figure 7B:
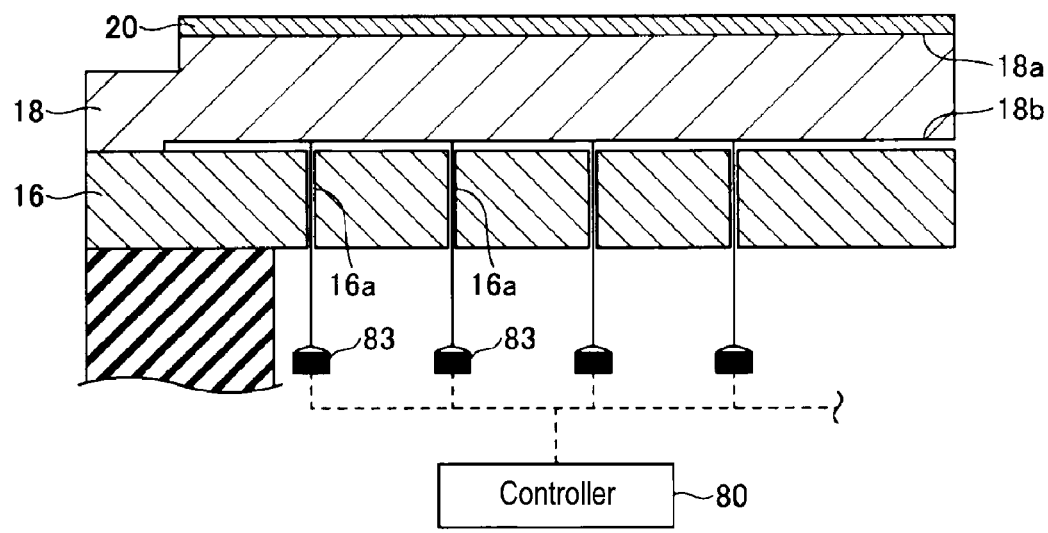

Next, an example in which the shape of the first plate 18 is measured and the temperature of the heat-conductive medium flowing through the first flow path 18f and/or the temperature of the heat-conductive medium flowing through the second flow path 16f is controlled based on the measurement result will be described with reference to FIGS. 7A and 7B. FIGS. 7A and 7B are views illustrating exemplary arrangements of a plurality of sensors according to an embodiment.

The stage 14 according to the embodiment may have the plurality of sensors for measuring the shape of the first plate 18. As illustrated in FIG. 7A, a plurality of strain gauges 81 and 82 are provided in the stage 4 as examples of the plurality of sensors. In the example of FIG. 7A, the plurality of strain gauges 81 are attached to an upper surface 18a of the first plate 18 (the bottom surface of the electrostatic chuck 20). In addition, the plurality of strain gauges 82 are attached to a bottom surface 18b of the first plate 18. The plurality of strain gauges 81 may be arranged in an adhesive layer (not illustrated) between the first plate 18 and the electrostatic chuck 20. A plurality of contraction and expansion values measured by the plurality of strain gauges 81 and 82 are sent to the controller 80. The controller 80 measures the shape of the first plate 18 based on the plurality of measured contraction and expansion values. Since the surface shape of the electrostatic chuck 20 changes depending on the shape of the first plate 18, it is possible to estimate the surface shape of the electrostatic chuck 20 by measuring the shape of the first plate 18.

The controller 80 controls the temperature of the heat-conductive medium in the first flow path 18f of the first plate 18 and/or the temperature of the heat-conductive medium in the second flow path 16f of the second plate 16 to match the measured shape of the first plate 18.

In this way, the temperature of the first plate 18 and/or the temperature of the second plate 16 are fed back according to the surface shape of the first plate 18 estimated from the measured values of the plurality of strain gauges 81 and 82. This makes it possible to actively control the surface shape (the surface shape of the electrostatic chuck) of the first plate 18 by controlling the temperature of at least one of the plates in real time.

However, the arrangement of the plurality of strain gauges 81 and 82 is not limited thereto. The plurality of strain gauges 81 and 82 may be attached to at least one of the upper surface 18a and the bottom surface 18b of the first plate 18, or may be attached to the bottom surface of the electrostatic chuck 20. The plurality of strain gauges 81 and 82 are examples of a plurality of strain sensors for measuring the shape of the first plate, and the plurality of strain sensors may be load cells.

As illustrated in FIG. 7B, as examples of the plurality of sensors, a plurality of laser interferometers 83 may be provided in the stage 14. The plurality of laser interferometers 83 are provided below the second plate 16 and irradiate the bottom surface 18b of the first plate 18 with laser light that has passed through the through-holes 16a penetrating the second plate 16. The plurality of laser interferometers 83 measure a distance to the bottom surface of the first plate 18 based on a time at which the light reflected by the bottom surface 18b is received. The controller 80 measures the shape of the first plate 18 based on the distances obtained from the plurality of laser interferometers 83. Since the surface shape of the electrostatic chuck 20 follows a change in the shape of the first plate 18, it is possible to estimate the surface shape of the electrostatic chuck 20 by measuring the shape of the first plate 18.

The controller 80 controls the temperature of the heat-conductive medium in the first flow path 18f of the first plate 18 and/or the temperature of the heat-conductive medium in the second flow path 16f of the second plate 16 to match the measured shape of the first plate 18.

In this way, the temperature of the first plate 18 and/or the temperature of the second plate 16 are fed back according to the surface shape of the first plate 18 estimated from the measured values of the plurality of laser interferometers 83. This makes it possible to actively control the surface shape of the first plate 18 by controlling the temperature of at least one of the plates in real time.

At this time, an irradiation device, such as a focuser, is fixed as a reference, and a change in length measurement becomes a change in the bottom surface of the electrostatic chuck 20. By feeding back this change, the temperature of the heat-conductive medium in the first flow path 18f of the first plate 18 and/or the temperature of the heat-conductive medium in the second flow path 16f of the second plate 16 is controlled in real time, which makes it possible to actively control the surface shape of the electrostatic chuck 20.

The method of controlling the temperature of the stage 14 includes a step of measuring the shape of the first plate 18, and a step of controlling the temperature adjustment mechanism of the first plate 18 and/or the temperature adjustment mechanism of the second plate 16 based on the measured shape of the first plate 18.

In the above description, the temperature adjustment mechanism of the first plate 18 and/or the temperature adjustment mechanism of the second plate 16 are controlled in real time based on the measured shape of the first plate 18. However, without being limited thereto, the shape of the first plate 18 may not be measured. The shape of the first plate 18 may be estimated with reference to the histories of temperature changes of the first plate 18 and the second plate 16 stored in the storage part, and information indicating the correlation between the temperature changes of the first plate 18 and the second plate 16 and the shape change of the first plate.

The information indicating the correlation between the temperature changes of the first plate 18 and the second plate 16 and the shape change of the first plate 18 may be stored in the storage part in advance by measuring the relationship between the shape change of the first plate 18 and the temperatures of the first temperature adjustment mechanism and the second temperature adjustment mechanism. The storage part may be a memory of the controller 80. The information indicating the correlation between the shape and the temperature change of the first plate 18 may be information indicating the correlation between the shape and the temperature change of the first plate 18 for flattening the shape of the first plate 18. In some embodiments, the information may also be information indicating the correlation between the shape and the temperature change of the first plate 18 for making the shape of the first plate 18 concave. In addition, the information may also be information indicating the correlation between the shape and the temperature change of the first plate 18 for making the shape of the first plate convex.

According to the temperature control method described above, it is possible to control the deformation of the stage 14. It should be noted that the substrate processing apparatus 1, the stage 14, and the temperature control method according to the embodiments disclosed herein are exemplary in all respects and are not restrictive. The above-described embodiments may be omitted, replaced or modified in various forms without departing from the scope and spirit of the appended claims. The matters described in the aforementioned embodiments may have other configurations to the extent that they are not inconsistent, and may be combined to the extent that they are not inconsistent.

For example, a plasma processing apparatus has been described as an example of the substrate processing apparatus. However, the substrate processing apparatus may be any apparatus, and is not limited to the plasma processing apparatus, as long as the substrate processing apparatus performs a predetermined processing (e.g., a film forming process or an etching process) on a substrate.

In addition, the substrate processing apparatus may be an etching apparatus, a film forming apparatus, an ashing apparatus, a doping apparatus, or the like. For example, the substrate processing apparatus may be an apparatus for forming an ITO film through a sputtering method or an apparatus for forming a metal-containing film through an MOCVD method.

The substrate processing apparatus of the present disclosure is applicable to any of an atomic layer deposition (ALD) type apparatus, a capacitively coupled plasma (CCP)

type apparatus, an inductively coupled plasma (ICP) type apparatus, a radial line slot antenna (RLSA) type apparatus, an electron cyclotron resonance plasma (ECRP) type apparatus, and a helicon wave plasma (HWP) type apparatus.

According to an aspect, it is possible to control deformation of a stage.

What is claimed is:

1. A substrate processing apparatus comprising:
a stage on which a substrate is placed, and
a controller,
wherein the stage includes:
a first plate;
a first temperature adjustment mechanism configured to control a temperature of the first plate;
a second plate provided below the first plate;
a second temperature adjustment mechanism configured to control a temperature of the second plate; and
a fastening member configured to fasten the first plate and the second plate;
wherein the controller is configured to control the first temperature adjustment mechanism and the second temperature adjustment mechanism, and
wherein the controller controls the first temperature adjustment mechanism and the second temperature adjustment mechanism such that the first plate and the second plate have a same temperature at a same timing.

2. The substrate processing apparatus of claim 1, wherein the stage includes an electrostatic chuck provided on the first plate and on which the substrate is placed.

3. The substrate processing apparatus of claim 2, further comprising a sensor configured to measure a shape of the first plate.

4. The substrate processing apparatus of claim 3, wherein the sensor includes a plurality of strain sensors provided on at least one of an upper surface of the first plate, a bottom surface of the first plate, and a bottom surface of the electrostatic chuck and configured to measure the shape of the first plate.

5. The substrate processing apparatus of claim 4, wherein the fastening member is a screw that is inserted into a screw hole provided in an outer periphery of the first plate and in an outer periphery of the second plate to fasten the first plate and the second plate.

6. The substrate processing apparatus of claim 5, wherein the first plate and the second plate are made of a same type of metal.

7. The substrate processing apparatus of claim 3, wherein the sensor includes a plurality of laser interferometers provided below the second plate, and configured to irradiate a bottom surface of the first plate with a laser beam that has passed through a through-hole penetrating the second plate so as to measure the shape of the first plate.

8. The substrate processing apparatus of claim 1, wherein the fastening member is a screw that is inserted into a screw hole provided in an outer periphery of the first plate and in an outer periphery of the second plate to fasten the first plate and the second plate.

9. The substrate processing apparatus of claim 1, wherein the first plate and the second plate are made of a same type of metal.

10. A method of controlling a temperature of a stage including a first plate, a first temperature adjustment mechanism configured to control a temperature of the first plate, a second plate provided below the first plate, a second temperature adjustment mechanism configured to control a temperature of the second plate, and a fastening member configured to fasten the first plate and the second plate, the method comprising:
(a) measuring a shape of a substrate placed on the stage; and
(b) controlling the first temperature adjustment mechanism or the second temperature adjustment mechanism based on the measured shape of the substrate,
wherein, in (b), the first temperature adjustment mechanism or the second temperature adjustment mechanism is controlled with reference to histories of temperature changes of the first plate and the second plate stored in a storage part in advance and information indicating a correlation between the temperature changes of the first plate and the second plate and a change in the shape of the first plate.

11. The method of claim 10, further comprising:
(c) measuring, after (b), the shape of the first plate.

12. A substrate processing apparatus comprising:
a stage on which a substrate is placed, and
a controller,
wherein the stage includes:
a first plate;
a first temperature adjustment mechanism configured to control a temperature of the first plate;
a second plate provided below the first plate;
a second temperature adjustment mechanism configured to control a temperature of the second plate; and
a fastening member configured to fasten the first plate and the second plate,
wherein the controller is configured to control the first temperature adjustment mechanism and the second temperature adjustment mechanism, and
wherein the controller controls the first temperature adjustment mechanism and the second temperature adjustment mechanism to change the temperature of the second plate while maintaining the temperature of the first plate constant.

13. The substrate processing apparatus of claim 12, wherein the stage includes an electrostatic chuck provided on the first plate and on which the substrate is placed.

14. The substrate processing apparatus of claim 13, further comprising a sensor configured to measure a shape of the first plate.

15. The substrate processing apparatus of claim 14, wherein the sensor includes a plurality of strain sensors provided on at least one of an upper surface of the first plate, a bottom surface of the first plate, and a bottom surface of the electrostatic chuck and configured to measure the shape of the first plate.

16. The substrate processing apparatus of claim 15, wherein the fastening member is a screw that is inserted into a screw hole provided in an outer periphery of the first plate and in an outer periphery of the second plate to fasten the first plate and the second plate.

17. The substrate processing apparatus of claim 16, wherein the first plate and the second plate are made of a same type of metal.

18. The substrate processing apparatus of claim 14, wherein the sensor includes a plurality of laser interferometers provided below the second plate, and configured to irradiate a bottom surface of the first plate with a laser beam that has passed through a through-hole penetrating the second plate so as to measure the shape of the first plate.

19. The substrate processing apparatus of claim 12, wherein the fastening member is a screw that is inserted into a screw hole provided in an outer periphery of the first plate and in an outer periphery of the second plate to fasten the first plate and the second plate.

20. The substrate processing apparatus of claim 12, wherein the first plate and the second plate are made of a same type of metal.

\* \* \* \* \*